US008718941B2

(12) United States Patent (10) Patent No.: US 8,718,941 B2
Williams et al. (45) Date of Patent: *May 6, 2014

(54) MONITORING AND DISPLAYING DEFLECTION OF LAYERS OF LANDFILL MATERIAL

(71) Applicant: GeoLogic Computer Systems, Waterford, MI (US)

(72) Inventors: Mark A. Williams, Saranac, MI (US); Alan R. Williams, Ann Arbor, MI (US)

(73) Assignee: Geologic Computer Systems, Inc., Waterford, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/745,087

(22) Filed: Jan. 18, 2013

(65) Prior Publication Data

US 2013/0144528 A1 Jun. 6, 2013

Related U.S. Application Data

(63) Continuation of application No. 11/122,925, filed on May 5, 2005, now Pat. No. 8,370,067.

(60) Provisional application No. 60/568,483, filed on May 6, 2004.

(51) Int. Cl.
 *G01V 3/38* (2006.01)
 *G01B 7/00* (2006.01)
 *G01B 5/02* (2006.01)

(52) U.S. Cl.
 USPC ............................. 702/5; 702/155; 702/170

(58) Field of Classification Search
 USPC .............. 702/150, 137, 155, 166, 167, 170, 5
 See application file for complete search history.

(56) References Cited

U.S. PATENT DOCUMENTS

| 5,471,391 | A | * | 11/1995 | Gudat et al. | 701/50 |
|---|---|---|---|---|---|
| 5,493,494 | A | * | 2/1996 | Henderson | 701/50 |
| 5,735,352 | A | * | 4/1998 | Henderson et al. | 172/4.5 |
| 6,188,942 | B1 | * | 2/2001 | Corcoran et al. | 701/50 |
| 6,460,006 | B1 | * | 10/2002 | Corcoran | 702/137 |
| 8,370,067 | B2 | * | 2/2013 | Williams et al. | 702/5 |

* cited by examiner

*Primary Examiner* — Sujoy Kundu
*Assistant Examiner* — Rocky Ngon
(74) *Attorney, Agent, or Firm* — Quinn Law Group, PLLC

(57) ABSTRACT

A method for developing a landfill with a compactor machine having a three-dimensional position sensing equipment, a computer, and a display. The method includes traversing the worksite with the compactor machine and determining deflection of the worksite at a plurality of locations while each of the locations is beneath the compactor machine. The compactor machine defines wheel tracks over which a plurality of wheels pass while traversing the worksite. The method includes recording the determined deflection of each of the locations on the display. The deflection may be recorded beneath only the wheel tracks of the compactor machine, such that areas passing between the wheel tracks of the compactor machine are not recorded on the display.

9 Claims, 6 Drawing Sheets

MONITORING AND DISPLAYING DEFLECTION OF LAYERS OF LANDFILL MATERIAL

CROSS-REFERENCE TO RELATED APPLICATIONS

This application is a continuation of prior application Ser. No. 11/122,925, filed May 5, 2005, now U.S. Pat. No. 8,370,067, which claims the benefit of U.S. Provisional Application No. 60/568,483, filed May 6, 2004; both of which are hereby incorporated by reference and the benefits of both of which are hereby claimed.

TECHNICAL FIELD

This disclosure relates to methods and systems using 3-D positioning systems, such as but not limited to GPS, for monitoring a landfill and landfill material added thereto.

BACKGROUND

In a landfill operation, trash and like material is typically spread over a work site in an uncompacted state and then repeatedly traversed by a compaction machine until the material is compressed to a desired degree. Typically, this involves the packing and orientation of solid articles into a more dense and effective arrangement for reducing air voids and like discontinuities. Compaction of material provides increased shear strength and density to enable further use of the material in construction operations.

Compacting operations are largely monitored and controlled intuitively by the machinery operators and supervisors, or by estimating the average characteristics of the material being deposited in the landfill, and then creating a model that tells the operator to compact the material in the landfill based upon that model. Such an approach may tell the operator to "roll" a "layer" a number of times "n" based upon the model. That is, the compactor may be directed to pass over (i.e., "compact") a worksite surface contour more than one time, as needed, to further compact (i.e., "densify") the layer of material just added. As such, efforts to electronically provide the operator with detailed information regarding the progress in the compaction effort have been made.

A common method used to determine compaction in landfills is to survey the surface and set stakes. As compacting machines roll the surface, they re-survey the stakes to determine when the practical point of refusal (the point at which diminishing movement causes one to decide that it is no longer cost effective to attempt to drive the surface down more.) has been reached. This method does not yield real time information over the working surface but instead provides a snapshot of progress.

In one known approach, a plurality of target stakes and an electronic unit for transmitting/receiving electronic signals are positioned about a worksite. Using a surveying-like apparatus, the electronic unit is vertically positioned on a tripod and signals are transmitted to and reflected back from the target stakes. The combination of distance and direction measurements is sufficient to determine the location and elevation of the target points, which data can be electronically stored and/or plotted on a map, converted into X-Y-Z coordinates, and used to generate a contour map. Because landfill unloading trucks and a compactor machine must constantly traverse the worksite, the operator must constantly position/reposition the stakes. This is very labor intensive and may generate an inaccurate cross-section. Critically, this cross-section derived contour map may give an indication of volume, but not the density of the landfill layer.

While the recent efforts have advanced the hit or miss approach of the earlier approaches, a simple yet effective method and system for estimating the density of the compacted landfill materials, using conventional apparatus would be desirable.

SUMMARY

A method for developing a landfill with a compactor machine is provided. The compactor machine has, or is equipped with, a three-dimensional position sensing equipment, a computer, and a display.

The method includes traversing the worksite with the compactor machine. The compactor machine defines wheel tracks over which a plurality of wheels pass while traversing the worksite. The also includes determining deflection of the worksite at a plurality of locations while each of the locations is beneath the compactor machine.

The method further includes recording the determined deflection of each of the locations on the display. The deflection may be recorded beneath only the wheel tracks of the compactor machine, such that areas passing between the wheel tracks of the compactor machine are not recorded on the display.

The above features and advantages, and other features and advantages, of the present invention are readily apparent from the following detailed description of some of the best modes and other embodiments for carrying out the invention, which is defined solely by the appended claims, when taken in connection with the accompanying drawings.

DETAILED DESCRIPTION

Figure 1A:
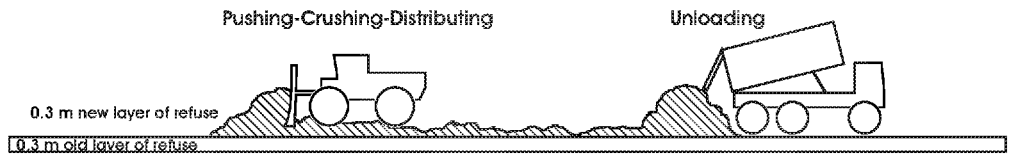
FIG. 1A is a schematic view illustrating thin-layer compaction of refuse material at a landfill site.
Figure 1B:
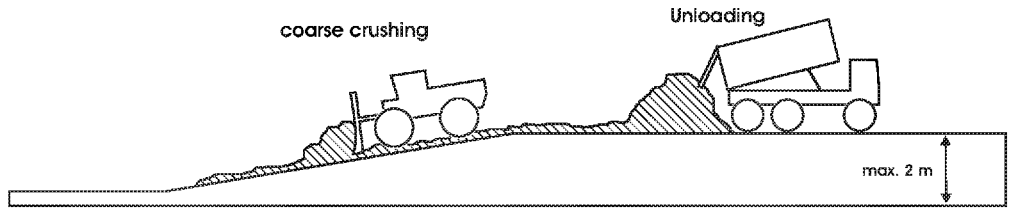
FIG. 1B is a schematic view illustrating upward movement and compaction of refuse material at a landfill site.
Figure 1C:
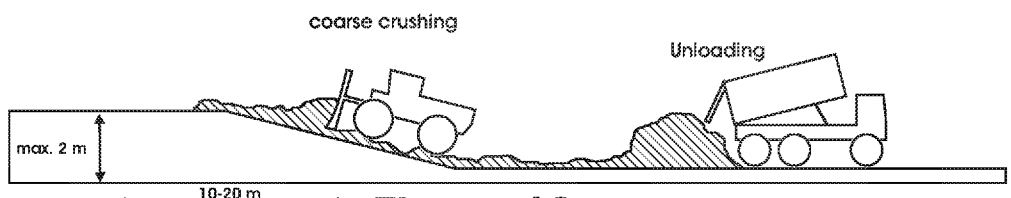
FIG. 1C is a schematic view illustrating downward movement and compaction of refuse material at a landfill site.
Figure 1D:
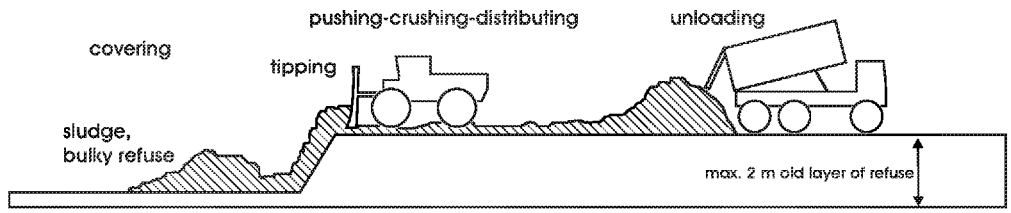
FIG. 1D is a schematic view illustrating edge-tipping of refuse material at a landfill site.

Referring to the drawings, like reference numbers correspond to like or similar components wherever possible throughout the several figures. While the present invention may be described with respect to automotive or vehicular applications, those skilled in the art will recognize the broader applicability of the invention. Those having ordinary skill in the art will recognize that terms such as "above," "below," "upward," "downward," et cetera, are used descriptively of the figures, and do not represent limitations on the scope of the invention, as defined by the appended claims. Any numerical designations, such as "first" or "second" are illustrative only and are not intended to limit the scope of the invention in any way.

Features shown in one figure may be combined with, substituted for, or modified by, features shown in any of the figures. Unless stated otherwise, no features, elements, or limitations are mutually exclusive of any other features, elements, or limitations. Furthermore, no features, elements, or limitations are absolutely required for operation. Any specific configurations shown in the figures are illustrative only and the specific configurations shown are not limiting of the claims or the description.

In packing of most earth material, such as sand or clay, it is possible to model the materials and the compaction process to calculate an equation for achieving the desired density. The equation calculates "y" number of times it is necessary to pack "x" thickness of material. However, this model is only good as long as the material being compacted is uniform in properties, such as shear strength, size distribution of particles, moisture, temperature, composition and other variables and it is placed at a constant thickness accurately. The model is, also, based upon machinery that compacts at constant rates. Yet, two different pieces of compacting machinery, for instance, may possibly have different characteristics, such as whether or not they both vibrate, whether or not the both weigh the same, have the same wheel shape and arrangement, etc. and thus differing compaction efficiencies for differing materials. Clearly, a model for optimum compaction based upon a system using screened sand of uniform moisture and temperature, placed at a uniform thickness on one given day by one machine would be less likely to result in errors in density than a model of material from an unknown source, of unknown strength, unknown moisture, with machines from two different manufacturers on the same site, etc.

In a landfill, or any air space permitted site, the optimum use of the site—i.e., to place the maximum material into that site—is of economic importance. The designed structure of the landfill requires containing materials to intersect contained materials. Errors in the placement of contained materials may result in less material being placed within the landfill than it is designed for or may result in containment structures that are not of minimum design thickness, slope and grade. Containment and placement of contained materials are normally penecontemporaneous.

The interface zone must be measured frequently to assure that the operators of the contained material moving machinery are indeed placing the material within the permit area. Maximizing the return on investment is achieved by getting the most material possible into a fixed amount of space. The systems and methods described herein are configured to maximize return on investment better than previous systems.

Previous systems did not provide details of density obtained from successive passes of the compactor over the landfill material. They also end up having an operator roll portions of the fill that have already reached the practical point of refusal.

An object of the systems and methods described herein is the provision of a 3-D positioning system, such as a GPS, a robotic transit and the like, in communication with digital data storage, retrieval, and processing computer apparatus or multiple computers, whose function is to: (a) measure the real time position of compacting and material moving equipment, (b) create contour maps for the purpose of estimating volume, and (c) create maps of relative deflection to allow the operator to determine when to stop compacting a specific area as a function of declining deflection. This volume data is then integrated with the weight data to calculate true density. This requires communication between the source of weight data, such as a scale house and the earth compacting or contouring machinery. Communication can be achieved through any suitable means, such as a wireless device, floppy disk, memory card or other data transferring device. The resulting calculation produces data in the form of weight per specific volume, such as pounds per cubic yard. The calculations can be done at the scale house, on the machine or in a third location.

The present system permits wireless communication between machines to indicate which areas of the working face need the most work in densification and which areas have newly placed material. Cross-sections generated in real time allow the operator or operators of the machines to construct lifts of material of uniform thickness. Layers are oriented in a planned surface to allow rainwater run off to collect in a central location without pooling and to make the placement of temporary cover and subsequent removal of such temporary cover easy and efficient.

The display of planned grades for the structure in cross-section allow operators to place material very close to the boundary limits for containment without exceeding these. Displays showing where a "lift" is incomplete allow operators to efficiently place new material and produce uniform lifts in thickness. Once a lift is complete, operators may automatically create new lift profiles in the field in real time which conform to the preset criterion for the development.

Data supplied from the earth modifying machinery collected at a control management computer or multiple computers may be used to display all movements of machinery in real time or over a selected period of time. Real time display is accomplished through wireless link whereas periodic display is accomplished through the use of electronic devices such as data stick, floppy disk or other transfer means. As that data is played back, one may look at the displays that each operator sees to determine the state of the fill at any time. Thus, the system hereof enables the monitoring of the use of time, distribution of material, deflection or any other functions which may be monitored or calculated by the machine's computer. It provides data which enables performance evaluation of the operators and determination if the site has the right mix of machinery based upon the volume of material coming in and the specific densities achieved with respect to costs, thus, providing a basis for modification of the amount of deflection set as optimum to either increase the amount of density achieved overall or decrease it to spread resources out over a greater area.

Machine reports are generated with the compilation of data which is time stamped and sorted by each machine. The data from which the daily contours are created comprises information including the speed of each machine throughout the day, the slope at which each machine is working, and the idle time of each machine. Using the collected data in the machine reports, one can determine the operation efficiency. It can also show the management how effective the operator was in getting density and also the amount of overfill on each layer the operator achieved. This information is valuable to the management so it can monitor the reliability of the operators who work under specific guide lines to achieve maximum density.

According to the one embodiment of the systems and methods described herein, starting with a first layer of material, a positioning device, preferably, a global positioning system (GPS) in communication with an on board computer on a compactor, compactor machine, or earthworking machine, and displays to the operator the position of the machine in a landfill. The computer collects and stores the position data, provides a time stamp, and the machine ID.

As the compactor spreads and densifies (compacts) the material, the display shows both the compactor and site in top view, indicating where the material has yet to be placed and in cross-section, the profile of the landfill design plus the profile of the lift. The computer display also shows the design surface for that lift and machine position relative to that design surface.

Each morning, or at some other desired time, the operator takes the previous days data and uses that data to generate a surface. That surface is defined using a TIN (Triangular Irregular Network). As the machine moves, it collects 3-D position information. It compares the thickness of the lift at that location with the previous thickness for that location for that discrete position. The thickness is derived by subtracting the starting TIN from the surface. The program displays the absolute value of the change in the thickness, the deflection. It then saves the new value for the thickness and stores that in a grid. The grid size is definable.

The footprints of the machine are definable. The rectangular footprint for each wheel of the machine is what changes the grid thickness values, and the footprint for each wheel defines wheel tracks for the vehicle. Similarly, wheel tracks may be defined by continuous tracks (which are usually driven by one or more wheels within the tracks).

This method works better than looking at elevation change to determine practical point of refusal because machines have large footprints. A footprint will cross several grid thickness cells. Elevation alone would have substantial errors across the machine footprint. A one on three slope using elevation could result in an error of as much as one foot for every three feet of distance across the footprint. When measuring thickness, the machine is going to be at the same, or near the same slope as the starting surface since most landfills are built as lifts (typically a design thickness of 10 feet or more chosen by the landfill supervisor or engineer) and in layers (a layer is built within the lift typically one to two feet thick, chosen by the landfill supervisor or operator of the machine and toggled within the program). In areas that are right at the edge of the layer, where the machine is plunging faster than the starting TIN, vector analysis allows us to adjust the antenna height to compensate for the tilt of the machine.

The starting display shows all areas as black, indicating no deflection data. The data model is built only as the machinery moves. Both negative and positive deflection are registered as absolute values. The operator chooses colors or symbols that represent deflection amounts. A large amount might be shown as red. A small amount, indicating that the practical point of refusal had been reached, may be represented as green. Color is unimportant though, one may set the screen to display "x"s or dashes, etc to represent the same things. The starting thickness is zero so if the machine registers deflection, it means an elevation change has occurred. This may be a result of the previous surface not being as dense as the preset value or it may be a result of new material being added. The thickness is recorded into the grid. On the next pass, the thickness is again compared to the previous thickness to derive deflection.

According to one method, the step of calculating the true density takes information from the machine to be correlated with the weight data. The data may be uploaded to the machine from the scales or the data from the machine may be sent to a remote site such as a scale house or the like and, optionally, from there to a third site, such as a central office. The data from the weighing device is time stamped so that weights may be correlated with volumes according to time stamps.

In some methods, that data is wirelessly sent to the third site from both the machine and from the second site. By calculating volume from the collected data and, then, dividing the total weight for the period of measured volume, density is determined as weight per unit volume. The methods and systems disclosed herein enable the landfill operator to achieve maximum landfill density, desired grade and slope, and ensure even distribution of valuable cover soil with increased accuracy without the use of traditional survey stakes.

Note that although the systems and methods described herein are directed to a landfill, the techniques are equally applicable to the preparation of other surfaces. For example, the systems and methods described herein have application to roads and like graded areas, as well as in those environments where it is desirable to optimize density in other materials.

In the ensuing description, it is to be understood that "top grade" is a function that allows the operator of the landfill equipment to offset the landfill design temporarily to establish a temporary lift or layer to a desired elevation within the design. Plan grades for intermediate goals or grades to control the landfill construction to a more controlled area are to help with drainage of water runoff to appropriate areas and away from inappropriate areas. This option offsets the design grades and creates a sloping plane to a desired elevation for drainage control. It factors in the direction of movement of the machines when creating this plane and asks the operator to set the degree of slope desired.

The topography of the worksite is altered or changed in that the operator is adding material in "layers" and "lifts". In landfill terminology, the term "layer" is a working thickness of material added. For the purpose of achieving a desired densification, this material is usually distributed in thin layers, oftentimes about one foot thick. The term "lift" refers to a planned elevation change and includes several compacted layers of trash or solid waste and a layer of cover material. Oftentimes a "lift" is ten feet or more thick.

Marking special points from the landfill equipment is useful in labeling specific locations of hazardous material, asbestos, concrete, wire, sludge, etc. Any known point with any reference which can be captured and placed in a special file for management purposes which may require further inquiry at a later date. Special points are stored on the landfill equipment, at the office in its own file, and labeled by date onto the hard drive. This transaction is completed by radio or data stick.

Turning to the drawings, in FIG. 1 there is shown pictorial depictions of a landfill being provided with landfill material, as is conventional. In FIG. 1A, a thin layer of waste stream is unloaded, pushed, crushed and distributed by an earth moving machine over a generally horizontal surface (typically at a slope or grade to allow runoff which is not shown), the machine including an adjustable scoop or blade portion. In FIGS. 1B and 1C, the earth moving machine is shown moving downwardly and upwardly relative to an inclined surface. In FIG. 1D, the earth moving machine is shown distributing material over an edge. In this succession of drawings, trash and like refuse is distributed over the landfill, and crushed to form a thin compacted layer.

Figure 2:
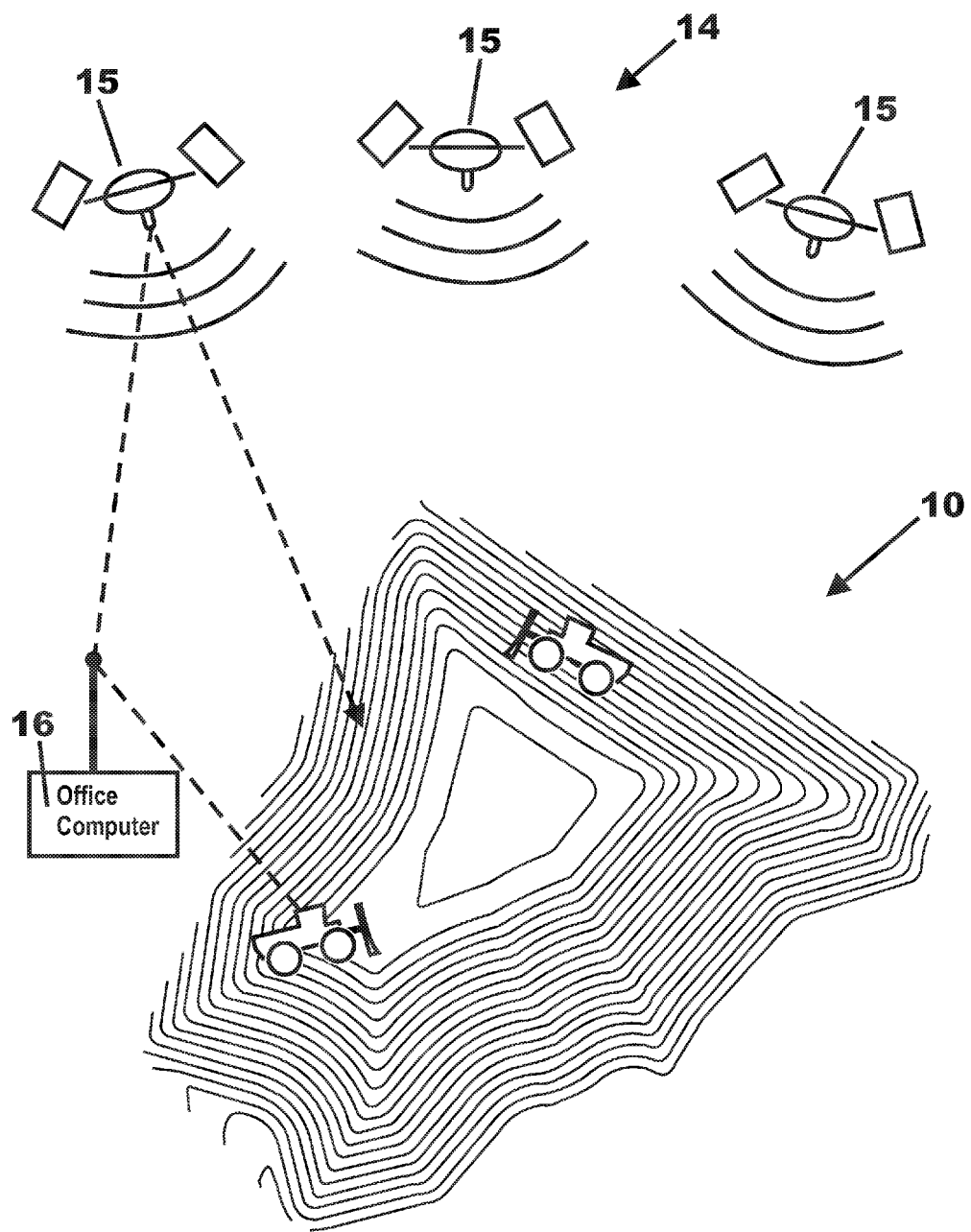
FIG. 2 is a schematic view of a system for monitoring and measuring surface elevations of a landfill and compaction of a layer of landfill material of known weight by a compactor, and ensuring that a desired density is achieved in each of successive layers of landfill material compressed by the compactor.

Turning to FIG. 2, there is shown a method and system wherein trash is spread over a generally horizontal, sloping contoured worksite 10, representing a landfill. Landfill trash or other refuse material of a known weight, which may vary in composition and density, is spread over the worksite, and is traversed and compressed by a compactor machine 12 and to such a degree that a desired densification of the landfill material is obtained.

The work site 10 to be land-filled is selected and may spatially differ as to contour, grade, and slope. That is, the work site 10 is three-dimensional and has different spatial surface elevations.

As illustrated in FIGS. 1A-1D, the landfill topography may have flat portions or configured with shaped, slanted, or tilted portions. For example, the worksite could include a trough shaped region defined by a raised outer periphery and a central trough. Layers of landfill material would be selectively distributed and compacted and the central trough built up.

A desired density of the trash or landfill material, spread over the worksite, is known in advance and can be changed as desired. A truck or similar trash conveying vehicle, such as shown in FIG. 1, is used to pile or otherwise deposit the trash or waste stream over the work site. The landfill material may vary in consistency, rigidity, shape, and have air pockets. As such, vertical compression or compaction of this landfill material, as received, is typically not predictable in advance.

The landfill material is weighed. In this approach, the truck weight before and after being filled with trash is weighed and the difference between the two weighings is the weight of the trash being spread. The trash is then generally uniformly spread over the worksite by dozer or compactor.

The compactor machine or dozer 12 then goes over the landfill material. This spreads out and compacts or otherwise compresses the material. The compactor machine is known in the art and will not be described in great detail herein. However, a conventional compactor machine includes either three or four large heavy steel wheels on machines which operate to substantially uniformly compress the landfill material over which the wheels roll.

Additionally, the compactor machine may comprise a heavy earth type machine including a shovel or blade member. The blade member may "dig into" the landfill material spread by the truck and further distribute this material across the worksite. This enables the layer of the landfill material to be changed, deflected, and/or redistributed as needed to achieve layer uniformity over the area of interest resulting from movement of the earth machine there over.

In the ensuing description, it is to be understood that the term "deflection" refers to the change in lift thickness measured when rolling a surface. If the original lift was one foot thick and rolling over it reduces the thickness to 0.9 foot, the deflection is 0.1 foot or 10%. As such, deflection is a measure of the relative density or estimated density. If the surface will not deflect from rolling on it, the material is at the practical point of refusal for that machine and that thickness. The measurement of the thickness is a key part of this calculation which differs from strictly looking at change in elevation. Large machines have large footprints. With deflection, the elevation is being compared to the starting surface. The layer is being put down parallel to the starting surface using the cross section screen on the computer.

A machine often is 12 feet wide or wider and may have a wheel base 12 feet long. When the design surface is not level, for instance it is a 1 on 3 grade (one foot rise for every three foot horizontal), a machine with a large footprint marks a large area with a single thickness each time it receives a position signal. Due to the construction parallel to the starting surface, that thickness is relatively constant across that 12 feet with this system. The stored thickness across that footprint would be the same. The next time the machine traverses a portion of that footprint, it will only look at the change in thickness. If one were to only look at elevation, up slope might be two feet higher than the center of the machine and down slope may be two feet lower. That entire footprint is marked as the same elevation on a grid map of elevation. When the machine passes over a portion of the footprint in the next pass or visit, it may register a large increase in elevation or it may register a large decrease in elevation depending upon which portion of the footprint it crossed. Elevation change on each pass or visit only equals deflection when the surface is level, something not very common in landfills.

Figure 3:
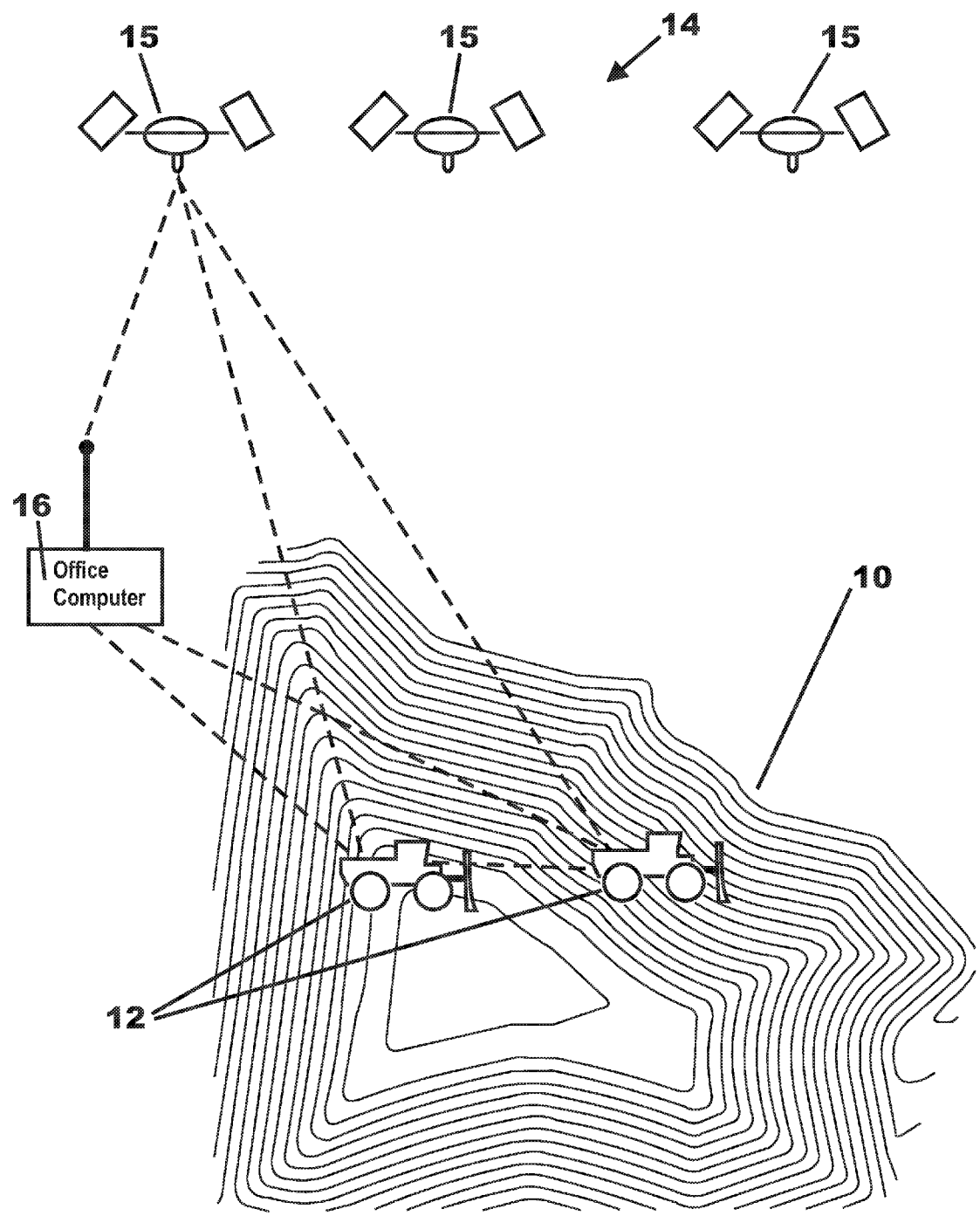
FIG. 3 is a view similar to FIG. 2 but showing multiple compactors operating on a landfill site.

A wireless communication system may be provided wherein a global positioning system (GPS) provides real time data acquisition to the machine computers. It provides storage and retrieval between the compactors and the office. It provides data exchange between the compactor and another compactor and/or dozer 121, (FIG. 3) on the worksite. It provides data communication between the GPS RTK base and the other GPS units on the machines for the purpose of position refinement.

A known GPS system, generally indicated at 14, is operably positioned, in space, above the worksite and includes at least three and, preferably, five or more satellites (or combination of satellites and pseudolites) 15, that provide time stamped signals that are used by GPS receivers at the base station 16 to provide error correction signals to the GPS receivers on the terrain modifying machinery 12. The GPS receivers calculate true position using this time stamped data. Importantly, the positioning system 14 measures in real time the X, Y, and Z coordinate data of the actual topography of the worksite, the data being representative of spatial elevations of the worksite. The satellites 15 provide signals that allow the receivers to generate three-dimensional geographic positions, which are then used to generate models representative of the actual geography of the site. This data is stored digitally on computers 18 on the machines 12, 121, then wirelessly transmitted to, and stored on the computer or computers 181 at the base station 16.

The computers 18 include digital data storage, retrieval, and processing computer apparatus. Computer apparatus 181 located at the base 16 is remote from but in wireless operable communication with the compactor machine computer 18 which is in communication with the GPS positioning receiver.

The computer 18 in the machine 12 creates, monitors, and compares three-dimensional X, Y, Z surface elevation data (i.e., changes in the Z-direction) with the starting site plan of the worksite. Further, the computer apparatus 18 determines the change in thickness (i.e. subtracts the starting surface elevation from the current elevation) of the worksite contour as there are additions and compression of each successive layer of trash. The three-dimensional data that is generated following compaction of the trash enables the equipment operator using the computer 18 and the landfill manager to determine, using computer 18, if an area being monitored has been compacted to the desired deflection level, the practical point of refusal.

The computer apparatus 18 via the GPS system 14 may direct the compactor machine 12, as needed to an area of the worksite to further compact the landfill material in that area should the surface deflection be more than the desired amount. Importantly, the compactor machine computer 18 may display, in real time, the monitored landfill area to enable the operator of the compactor machine to monitor the ongoing densification of the trash layers added to the surface.

Initially, a first three-dimensional geographic site model is generated, representing the X,Y,Z coordinate data of the actual worksite before the landfill material is spread over the contour. This may be referred to as a starting TIN. A known quantity of landfill material is spread over the worksite, and the landfill material compressed or otherwise pushed about by the blade of an earth moving machine or compactor machine. The landfill material thus added provides the worksite with a first layer of compressed/compacted material.

Following compression of the initial layer a second three dimensional geographic site model representing the X,Y,Z coordinate data or topography of the worksite is then generated, and the digitized model of the site map stored in the computer apparatus.

The data from the second site model is compared with the data from the first site model. The models can be compared using a differencing algorithm, such as contained in SURFER™ which is able to compute the volume of material contained between the surfaces.

Density is generally represented as the ratio of weight per volume, the landfill operator is provided with substantially real time information as to density of the layer of trash spread on the worksite. That is, the computer software ratios the two parameters (volume and weight) and provides the user with an estimate or indication of the density in the layer thus added and compressed. The volume of the material added by the layer is related to the vertical separation (in the Z-direction) between the two three-dimensional surface elevations. The weight of the landfill material spread (measured at the scale house) is related to the X-Y-Z area of which it is deposited. The spatial ratio of the volume and weight values provides an estimate of density following compaction of the layer.

This actual density is compared to a desired density and the compactor or earth moving machine is instructed to change its deflection parameter accordingly to compensate.

Referring now to FIGS. 4A-D, and with continued reference to FIGS. 1A-3, there are shown schematic views illustrating measurement of thickness and deflection relative to triangular irregular network (TIN) models of worksite surfaces.

Figure 4A:
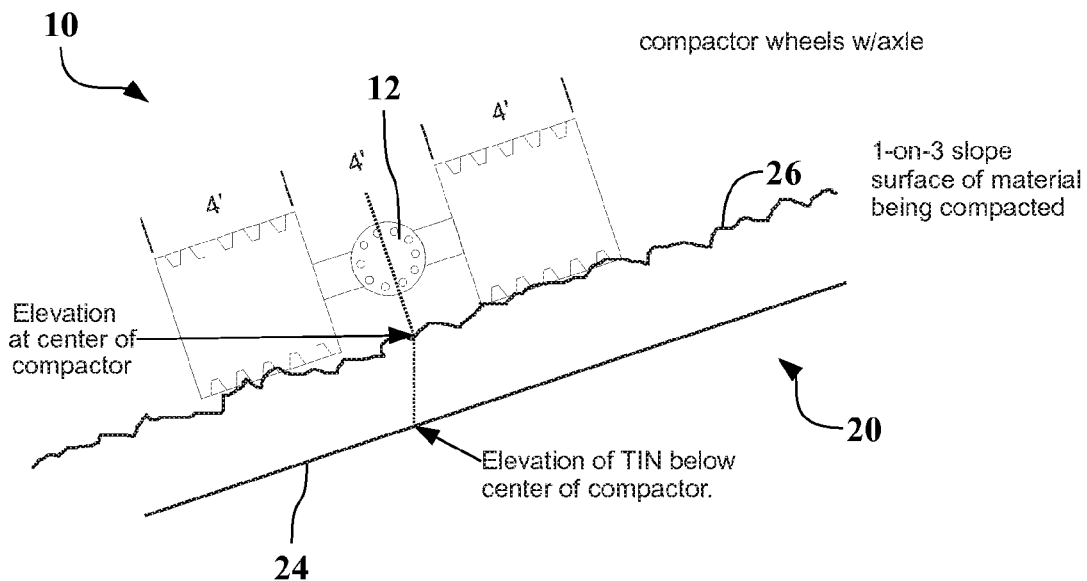
FIG. 4A is a schematic view illustrating measurement of thickness and deflection relative to a triangular irregular network (TIN) model of surfaces, showing a compactor machine and a general location relative to the TIN.
Figure 4B:
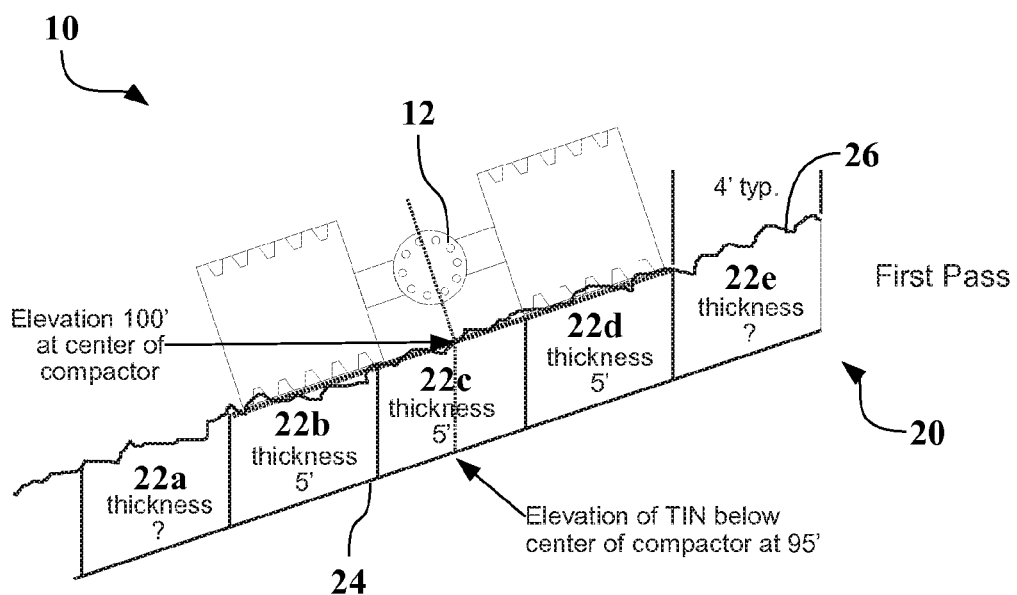
FIG. 4B shows a first pass over the general location shown in FIG. 4A.
Figure 4C:
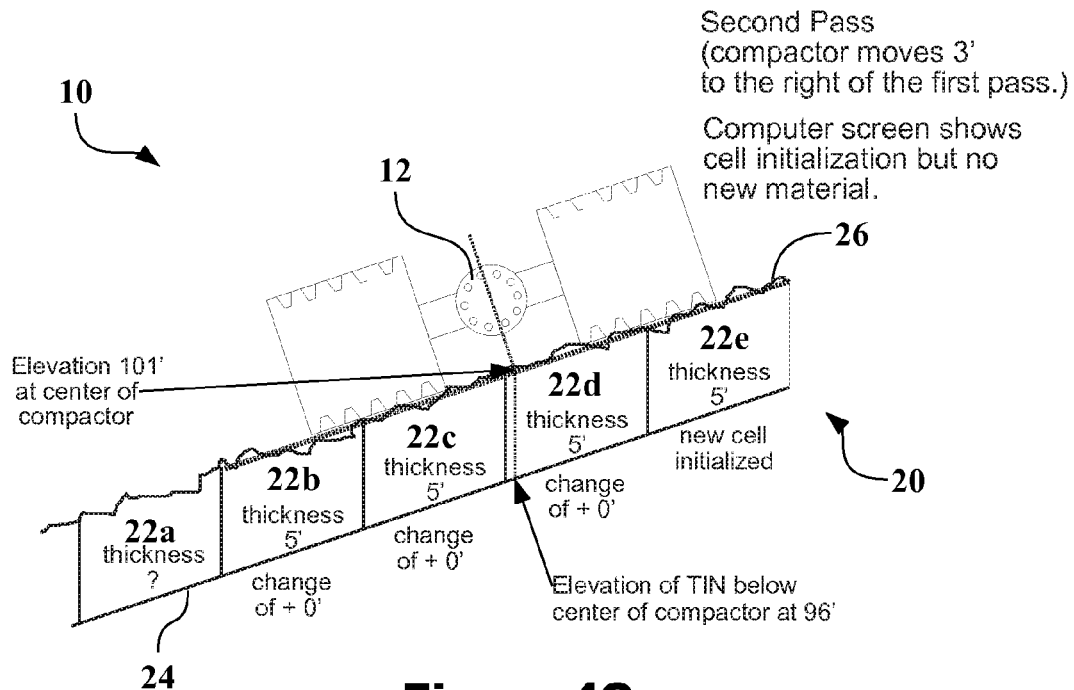
FIG. 4C shows a second pass over the same general location shown in FIG. 4A.
Figure 4D:
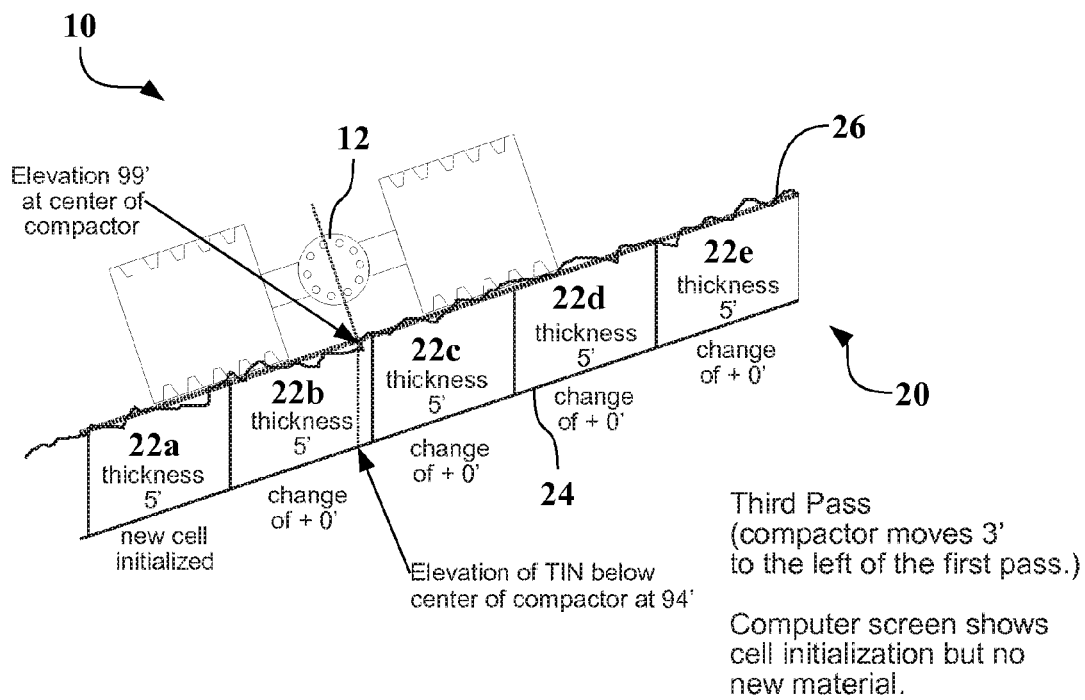
FIG. 4D shows a third pass over the same general location shown in FIG. 4A.

FIG. 4A shows the compactor machine 12 relative to a general location 20 of the worksite 10. FIGS. 4B-4D show the compactor machine 12 making a first pass, a second pass, and a third pass over the location 20, respectively. In the illustrative situation, the worksite 10 has a 1-on-3 slope.

The worksite 10 is shown illustratively divided into grid cells 22 in FIGS. 4B-4D, but is not required to be so divided. The grid cells 22 may assist in illustrating the process of determining thickness and deflection and may reduce computational resources needed by breaking the worksite into a finite number of elements. From left to right in FIGS. 4B-4D, the grid cells 22 have been assigned reference numbers 22*a*, 22*b*, 22*c*, 22*d*, and 22*e*, respectively.

A starting TIN 24 represents the starting surface of the worksite 10, such as at the beginning of the day or the earthworking shift. After the starting surface was modeled as the starting TIN 24, a new layer 26 of material was added to the worksite. This new layer 26 has caused the actual worksite surface to be raised. However, the new layer 26 may need to be compacted, and may not be the correct thickness to achieve the eventual site plan for the worksite 10.

As shown in FIG. 4B, as the compactor machine 12 makes a first pass, the computer method assigns the same thickness to cells 22*b*, 22*c*, and 22*d*, as opposed to assigning the same elevation. The thickness of the respective grid cells 22 is determined based upon the difference between the elevation of the compactor machine 12 and the starting TIN 24, as determined by the computer and the 3D positioning system. In the example illustrated in the figures, the thickness is 5 feet.

Importantly, as shown in FIG. 4C, as the compactor machine 12 makes a second pass, the computer does not mistakenly identify new material just because the compactor machine 12 is higher up the slope. As the compactor machine 12 moves 3 feet to the right of the first pass, its elevation is higher than the first pass. However, the systems and methods described herein are determining the thickness of the material (or material layer) instead of the elevation, so the computer recognizes that there is no change in the thickness of cells 22*b*, 22*c*, and 22*d*.

The third pass of the compactor machine 12 has a similar effect, as shown in FIG. 4D. Although the compactor machine 12 is 2 feet lower in elevation than the previous pass, the computer recognizes that the thickness of the material has not changed. Therefore, the operator would be alerted that no deflection has occurred and that these cells are not in need of further earthworking operations.

Focusing, for example, on cell 22*b*, FIGS. 4B-4D also demonstrate determination of deflection by the computer monitoring data from the compactor machine 12. From the first, second, and third passes, the computer determines that cell 22*b* has a thickness of 5 feet relative to the starting TIN 24. Therefore, by comparing thickness of each pass, the computer determines that cell 22*b* has substantially zero deflection and has reached its practical point of refusal.

As a further example, if the computer had determined that cell 22*b* had thicknesses of 5 feet, 4.5 feet, and 4.4 feet on the first, second, and third passes, respectively, the computer may have also determined that cell 22*b* has reached its practical point of refusal. Deflection may be determined on an absolute basis—i.e., as 0.5 feet and then 0.1 feet—or on a percentage basis—i.e., as 10% and then 2.2%. Regardless of how the deflection is characterized, the computer recognizes that deflection below a certain value demonstrates that the cell 22*b* below the wheel tracks of the compactor machine 12 has reached its practical point of refusal.

The operator may be alerted to the lack of deflection via colorized changes on a monitor or display in the compactor machine 12. In some configurations or embodiments, the whole footprint of the compactor machine 12 may be assumed to have reached the practical point of refusal. However, in other configurations, only the deflection of the actual wheel tracks under the wheels of the compactor machine 12 may be considered as having been determined.

Furthermore, the display may record only deflection of the wheel tracks of the compactor machine 12, as opposed to the whole footprint of the compactor machine 12. In FIGS. 4B-4D, the wheel tracks of the compactor machine 12 touched each of the cells 22*a*-22*e*, so the computer may have alerted the operator that the location 20 is not in need of further compaction.

Depending on the area being measured and whether the desired deflection has been achieved, the computer program may regenerate the site surface, such that the newly added layer becomes the reference or actual layer—i.e., the starting TIN 24, and a subsequent new layer 26 is then spread onto the worksite 10. This may be continued until a desired height and cross-section is obtained, following successive fills.

It should be noted that relative deflection does not assume to model incoming material. It is merely a measurement of how much the thickness is deflected each time the machine passes over the surface. When further compaction produces either no deflection or some predetermined goal for optimum deflection, the deflection map indicates to the operator that no further compacting is necessary in that spot leaving the operator to work in other areas not showing optimum deflection reduction. The present system also displays the level of deflection at any specific spot and percent of goal. As an example, a selected color, e.g. red, may be used to display areas that have deflected a lot from the previous pass or which have new material. A second color, such as green may be used to indicate that the goal has been achieved. Other colors may be selected to indicate how close to the goal each pass comes in each spot. The display may start with a black screen, a white screen or some other color not being used to indicate deflection, and only shows deflection in areas traversed since the model was updated. However, it is also possible to retain the deflection colors from the previous surface or surfaces, if desired.

Color is unimportant though, and according to the systems and methods described herein, the user may set the computer program to display a graphical image on the computer screen to represent the footprints of the machines. The image may be in the form of "x"s, dashes, slash marks, hachure marks or ASCII characters, and represent the same thing, such as deflection or density, as desired.

Figure 5:
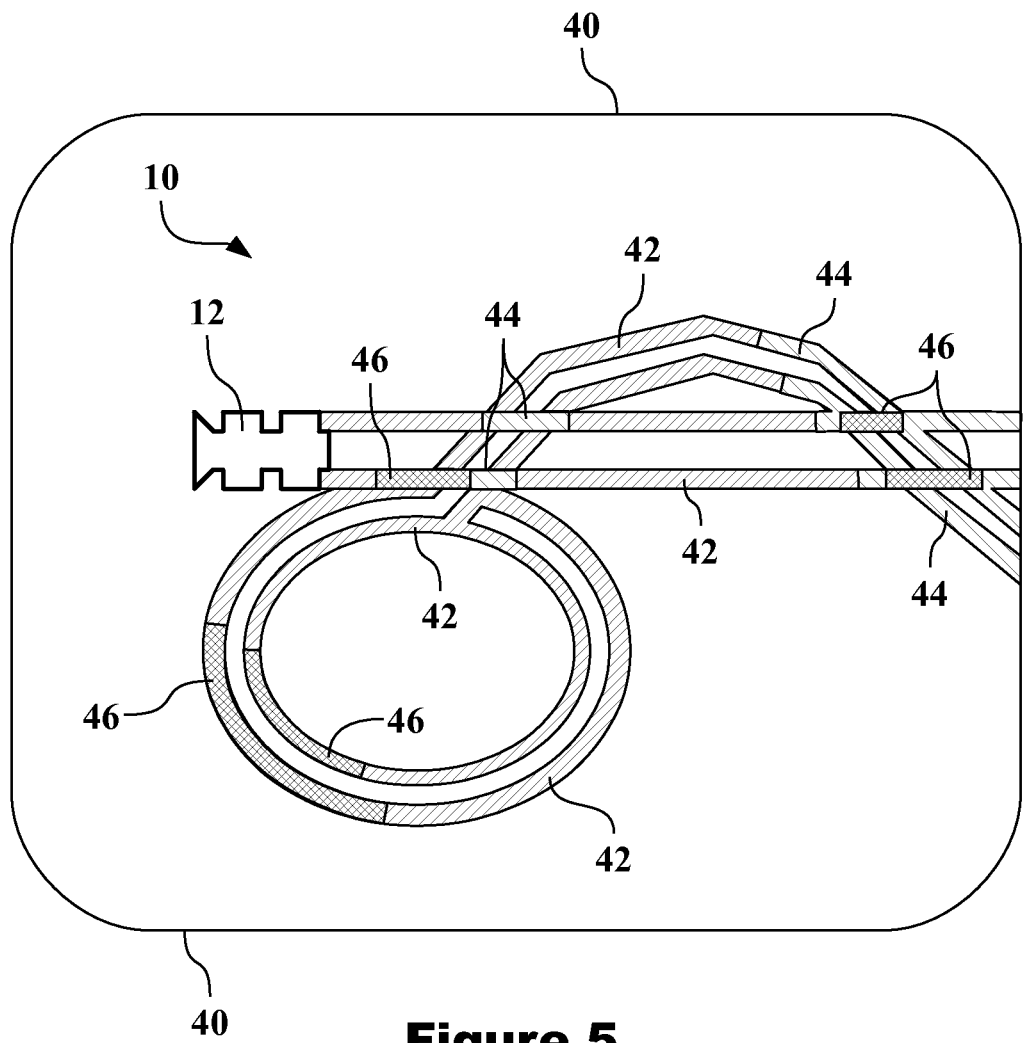
FIG. 5 is schematic view illustrating a graphical display recording deflection of the worksite as a compactor machine traverses a worksite.

Referring now to FIG. 5, and with continued reference to FIGS. 1A-4D, there is shown a schematic illustration of one possible display style or display screen 40 for recording and showing measured or determined deflection as the compactor machine 12 traverses the worksite 10. The view shown in FIG. 5 may be representative of the picture shown on the display screen 40 on-board the compactor machine 12.

The view shown may be one of multiple screen options selectable by the operator of the compactor machine 12 or there may be multiple display screens 40 showing different data for the worksite 10 relative to the compactor machine 12. For illustrative purposes, only a portion of the worksite 10 is shown in FIG. 5, and turnaround areas or areas in which vehicles are dumping refuse may not be shown.

Whenever there is a new starting surface generated, the display screen 40 begins as blank or as a solid color. This is illustrated as white, or empty, area in the FIG. 5. However, once the compactor machine 12 has traversed the worksite 10 and the computer has determined deflection for areas beneath the wheel tracks, the display screen 40 shows the level of determined deflection below the wheel tracks. New material added to the worksite 10 will be incorporated as that new material is traversed and deflection of the new material is measured. The compactor machine 12 may be configured to recognize the difference between new material (which likely raises the elevation compared to prior passes) verses compaction of previously-traversed material.

A first deflection region 42 shows a first level of deflection beneath the wheel tracks of the compactor machine 12. The first deflection region 42 may be, for example, areas or large deflection. Alternatively, the first deflection region 42 may be colored red, showing that those areas are not yet complete and need further work from the compactor machine 12 in order to reach the practical point of refusal.

A second deflection region 44 shows a second level of deflection beneath the wheel tracks of the compactor machine 12. The second deflection region 44 may be, for example, areas or medium deflection. Alternatively, the second deflection region 44 may be colored yellow, showing that those areas are not yet complete and need further work from the compactor machine 12 in order to reach the practical point of refusal, but are not deflecting as substantially as the first deflection region 42.

A third deflection region 46 shows a third level of deflection beneath the wheel tracks of the compactor machine 12. The third deflection region 46 may be, for example, areas or small or no deflection. Alternatively, the third deflection region 46 may be colored green, showing that those areas need no further work from the compactor machine 12 and have already reached the practical point of refusal. On subsequent passes, the operator will try to avoid any portions of the third deflection region 46 so that the time and energy needed to operate the compactor machine 12 is used on areas requiring further compaction.

The different levels of deflection shown on the display screen 40—i.e., the first deflection region 42, the second deflection region 44, and the third deflection region 46—may be due to any of several factors. For example different materials deflect differently on first pass of the compactor machine 12, such that rock and cement rubble may deflect very little and may initially read as the third deflection region 46 but food waste may deflect greatly and initially read as the first deflection region 42. Furthermore, some of the locations of little deflection, shown as the third deflection region 46, may be the result of the compactor machine 12 having traversed those locations previously, such that those locations change from the first deflection region 42 to the third deflection region 46 on the display screen 40.

The method may assign the entire length of the comparator machine 12 to the determined deflection below the compactor machine 12. Furthermore, the method may assign different thickness measurements, and therefore different deflections, to the right and left side of the compactor machine 12.

Hachures may represent the slope of the land—the more gentle the slope, the fewer the lines—and the absence of line indicates flat terrain. As each line signifies an increase or decrease in the land elevation, one can accurately calculate height by simply counting the lines from the base line. The slope of any change in the landscape relief can also be determined by noting the proximity of the contour lines to one another. A high concentration of lines tells the map user that the elevation changes sharply, while widely spaced lines indicate a gradual slope.

Preferably, the starting thickness of the landfill is zero so if the machine registers deflection, it means that no elevation change has occurred. This may be a result of the previous surface not being as dense as the preset value or it may be a result of new material being added. The thickness is recorded into the grid. On the next pass, the thickness is again compared to the previous thickness to derive deflection.

Associated with the computer software are the following actuatable control buttons: "Top Grade Control", "Layer Control", and "Land Cover". A "Top Grade" reading permits the operator to establish a land elevation having a desired slope, as needed and the "Top Grade Control" button prevents an overbuilding of the edge of the contour or outer slope. Importantly, an interactive control of contour slope allows the operator to drain water in a desired direction and slope.

The "Layer Control" button permits the landfill operator to build up the land in variable "n" foot layers. Preferably, the operator adds about one foot during any incremental increase or spreading of additional landfill material and then compacts this added material.

The "Land Cover" button will permit the operator to calculate how much soil is needed to cover the landfill trash added, at the end of the day, an everyday process. The operator can enter how thick the cover soil should be as well as how many cubic yards of soil are needed to cover the trash. This will indicate to the operator the presence of a new layer wherein to grade the cover soils evenly.

Further, a cross-section view of the landfill and the blade of the earth moving machine in relation to the proposed design grade can be generated, both in the computer apparatus in the office as well as the computer on the earth moving machine. This cross-section view of the landfill will provide an indication to the operator of how many feet of landfill trash the operator needs to add before airspace limits are reached.

Advantageously, the GPS and computer software are adapted to mark special points on the the dimensional geographic site model special points in the landfill, such as sludge, contaminated soils, concrete, or any special waste item desired. These locations are marked with GPS coordinates and saved for future reference.

The computer has stored therein a desired worksite that is defined through the use of TINs (Triangular Irregular Networks). That defined worksite includes the original surface, as built to put material in. It also includes the finished landfill. The computer program also has information that defines how layers will be built and a setting for a desired coefficient of deflection. In the design of layers which will eventually completely fill the air space of the landfill, layer surfaces are constructed using TINs. These TINs can be expressed in the program as cross-sections and will be set to produce a working layer on top of a previous surface.

When calculating a cross section (a plane made by cutting across the worksite at a right angle to the x-y plane) of the landfill, the starting surface is raised uniformly by a pre-set amount to form a desired surface. The cross section is displayed to the operator to assist in moving and placing material according to the ultimate site plan or the individual layer under construction at that time.

In addition to measuring deflection, it is possible to measure actual density on a batch basis as often as the landfill supervisor wishes. It should be noted that the requisite computer software for practicing the present method is and available under the mark GEOSITE, as sold by GeoLogic Computer Systems.

It should be noted that in lieu of measuring compaction as is done in some systems, the systems and methods described herein can be adapted to measure thickness and, therefrom, the deflection of the material. In such circumstances, by installing slope sensors or other means for detecting the slope of the machines, the changing elevation of the machine can be determined. This enables the thickness of the layer to be calculated over the entire footprint of the machine and, thus, the thickness of the layer can be determined. Thickness information enables determination of the deflection based upon the change, if any, in thickness. This inclination information can then be stored along with wheel footprint and position so that the model of the terrain can be updated without slope error and can be displayed to the operator.

The detailed description and the drawings or figures are supportive and descriptive of the invention, but the scope of the invention is defined solely by the claims. While some of the best modes and other embodiments for carrying out the claimed invention have been described in detail, various alternative designs, configurations, and embodiments exist for practicing the invention defined in the appended claims.

The invention claimed is:

1. A method for developing a landfill with a compactor machine having three-dimensional position sensing equipment, a computer, and a display, the method comprising:
traversing the worksite with the compactor machine, wherein the compactor machine defines wheel tracks over which a plurality of wheels pass while traversing the worksite;
determining, with the computer, deflection of the worksite at a plurality of locations while each of the respective locations is beneath the compactor machine, wherein determining deflection includes:
setting a common reference point at each of the respective locations beneath the compactor machine;
measuring a first thickness above the common reference point at each of the respective locations beneath the compactor machine, wherein the first thickness is the distance between the common reference point at the respective location and the compactor machine;
measuring a second thickness above the common reference point at each of the locations, wherein the second thickness is the distance between the common reference point at the respective location and the compactor machine; and
calculating the difference between the first thickness and the second thickness at each of the locations, wherein the calculated difference between the first thickness and the second thickness is the deflection of the worksite;
recording the determined deflection of each of the respective locations on the display beneath only the wheel tracks of the compactor machine, such that areas passing between the wheel tracks of the compactor machine are not recorded on the display.

2. The method of claim 1, wherein recording the determined deflection on the display includes using one of color and graphical images to represent wheel tracks of the machine.

3. The method of claim 2, wherein the display records no color and no graphical images at any of the plurality of locations until such time as the compactor machine traverses the worksite and determines deflection of the locations.

4. The method of claim 1, wherein recording the determined deflection on the display includes using a first color corresponding to a first amount of deflection and a second color corresponding to a second amount of deflection.

5. The method of claim 1, wherein the wheel tracks are recorded on the display by one of slashes, letters, and hachure marks to form an image representative of the measured deflection at the wheel tracks.

6. A method for developing a landfill with a compactor machine having three-dimensional position sensing equipment, a computer, and a display, the method comprising:
storing in the computer a starting Triangular Irregular Network (TIN) model representing a starting surface of the worksite, the starting TIN model representing the elevation of the starting surface from previous land filling activity;
depositing a new layer of landfill material onto the starting surface of the worksite;
compacting the new layer with the compactor machine by traversing the worksite;
monitoring instantaneous x, y, z coordinate values with the three-dimensional position sensing equipment while compacting the new layer;
comparing the instantaneous x, y, z coordinate values with x, y, z coordinate values of the starting TIN model;
determining a first thickness from the measured difference between z coordinates of the instantaneous x, y, z coordinate values and the x, y, z coordinate values of the starting TIN model on each visit of an identifiable location defined by x, y coordinates;

after deriving the first thickness, continuing to traverse the worksite while comparing the instantaneous x, y, z coordinate values with x, y, z coordinate values from the starting TIN model;

determining a second thickness on a subsequent traversal of the identifiable location;

measuring a deflection of the material between the first thickness and the second thickness; and creating a graphical display of the measured deflection.

7. The method of claim 6, wherein the graphical display shows the measured deflection only beneath the wheel tracks of the compactor machine, such that areas passing between the wheel tracks of the compactor machine are not recorded on the display.

8. The method of claim 7, wherein creating the graphical display includes using a first color corresponding to a first amount of deflection and a second color corresponding to a second amount of deflection.

9. The method of claim 7, wherein the wheel tracks are shown on the graphical display by one of slashes, letters, and hachure marks to form an image representative of the measured deflection at the wheel tracks.

* * * * *